US011072855B2

(12) United States Patent
Taha et al.

(10) Patent No.: US 11,072,855 B2
(45) Date of Patent: Jul. 27, 2021

(54) VANADIUM OXIDE FILMS AND METHODS OF FABRICATING THE SAME

(71) Applicant: Royal Melbourne Institute of Technology, Melbourne (AU)

(72) Inventors: Mohammad Taha, Melbourne (AU); Sumeet Walia, Melbourne (AU); Sharath Sriram, Melbourne (AU); Madhu Bhaskaran, Melbourne (AU)

(73) Assignee: ROYAL MELBOURNE INSTITUTE OF TECHNOLOGY, Melbourne (AU)

( * ) Notice: Subject to any disclaimer, the term of this patent is extended or adjusted under 35 U.S.C. 154(b) by 328 days.

(21) Appl. No.: 15/668,823

(22) Filed: Aug. 4, 2017

(65) Prior Publication Data
US 2019/0040526 A1 Feb. 7, 2019

(51) Int. Cl.
*C23C 14/58* (2006.01)
*C23C 14/00* (2006.01)
(Continued)

(52) U.S. Cl.
CPC .......... *C23C 14/5806* (2013.01); *C01G 31/02* (2013.01); *C23C 14/0036* (2013.01);
(Continued)

(58) Field of Classification Search
CPC .............. C01G 31/02; C23C 14/34–46; C23C 14/5806
See application file for complete search history.

(56) References Cited

U.S. PATENT DOCUMENTS

2012/0188628 A1 7/2012 Chang et al.
2012/0258858 A1* 10/2012 Chemin ................. C03C 17/23
502/353
(Continued)

FOREIGN PATENT DOCUMENTS

CN 1598040 A * 3/2005
CN 104593738 A 5/2015
(Continued)

OTHER PUBLICATIONS

Xu et al., Effect of porous morphology on phase transition in vanadium dioxide thin films, 33(6) J. Vac. Sci. Tech. (Year: 2015).*
(Continued)

*Primary Examiner* — Rodney G McDonald
*Assistant Examiner* — Ho-Sung Chung
(74) *Attorney, Agent, or Firm* — Patterson + Sheridan, LLP

(57) ABSTRACT

Method for fabricating a crystalline vanadium oxide ($VO_2$) film comprising the steps of: a) depositing an amorphous $VO_2$ film on a substrate by pulsed DC magnetron sputtering using a vanadium target, wherein the substrate is exposed to a sputtering gas comprising an inert process gas and oxygen ($O_2$), and the substrate has a temperature of less than about 50° C.; and b) annealing the deposited amorphous $VO_2$ film to crystallise the amorphous $VO_2$ film into a crystalline $VO_2$ film that exhibits an insulator-metal transition. The disclosed method for fabricating a crystalline $VO_2$ film may be suitable for a broad range of substrates.

20 Claims, 8 Drawing Sheets

(51) Int. Cl.
- C01G 31/02 (2006.01)
- C23C 14/35 (2006.01)
- C23C 14/08 (2006.01)
- C23C 14/34 (2006.01)

(52) U.S. Cl.
CPC ........ *C23C 14/083* (2013.01); *C23C 14/3485* (2013.01); *C23C 14/35* (2013.01)

(56) References Cited

U.S. PATENT DOCUMENTS

| | | |
|---|---|---|
| 2016/0032443 A1 | 2/2016 | Gu et al. |
| 2016/0070033 A1 | 3/2016 | Schlott et al. |

FOREIGN PATENT DOCUMENTS

| | | | |
|---|---|---|---|
| CN | 103320751 B | * | 8/2015 |
| CN | 104961354 A | * | 10/2015 |
| WO | 2017045398 A1 | | 3/2017 |

OTHER PUBLICATIONS

Tao et al., machine translation, CN 104961354 A (Year: 2015).*
Wu et al., machine translation, CN 103320751 B (Year: 2015).*
Wang et al., machine translation, CN 1598040 A (Year: 2005).*
Taha et al., Insulator-metal transition in substrate-independent VO2 thin film for phase-change devices, 7:17899 Sci. Reports (Year: 2017).*
"High performance VO2 thin films growth by DC magnetron sputtering at low temperature for smart energy efficient window application"; Zhang et al. Journal of Alloys and Compounds 659 (2016) 198-202.
"Design, formation and characterization of a novel multifunctional window with VO2 and TiO2 coatings"; Jin et al., Appl Phys., A 77, 455-459 (2003).
"Effect of oxygen stoichiometry on the insulator-metal phase transition in vanadium oxide thin films studied using optical pump-terahertz probe spectroscopy"; Liu et al., Appl. Phys. Lett., 103, 151908 (2013).
"Effects of Annealing Parameters on Optical Properties of Thermochromic VO2 Films Prepared in Aqueous Solution"; Kang et al., J. Phys. Chem. C., 2010, 114, 1901-1911.
"Growth mode and texture study in vanadium dioxide thin films deposited by magnetron sputtering"; Xiong-Bang et al., J. Phys. D: Appl. Phys., 41 (2008) 055303.
"Influence of defects on structural and electrical properties of VO2 thin films"; Chen et al., J. Appl. Phys., (2011), 110, 023707.
"Terahertz conductivities of VO2 thin films grown under different sputtering gas pressures"; Luo et al., Journal of Alloys and Compounds, 655 (2016) 442-447.
"Low-temperature method for thermochromic high ordered VO2 phase formation"; Melnik et al., Materials Letters 68 (2012) 215-217.
"Thermochromic VO2 films by thermal oxidation of vanadium in SO2"; Ji et al. Solar Energy Materials & Solar Cells, 144 (2016) 713-716.
"Intelligent Window Coatings: Atmospheric Pressure Chemical Vapour Deposition of Tungsten-Doped Vanadium Dioxide"; Manning et al., Chem. Mater., 2004, 16, 744-749.
"Optical properties of vanadium oxides—an analysis"; C. Lamsal et al., J Mater Sci (2013) 48: 6341-6351.

* cited by examiner

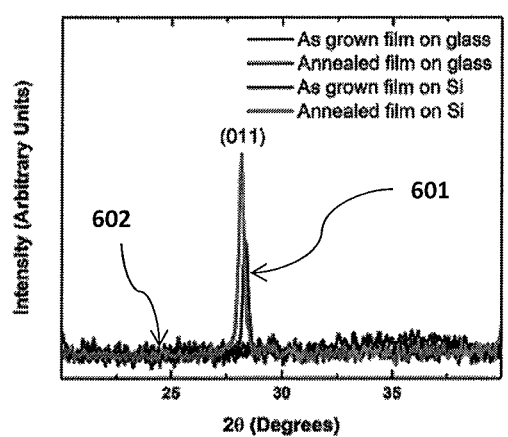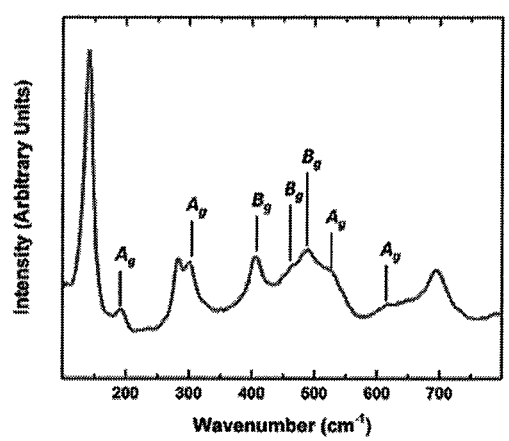
FIG. 4a
FIG. 4b

VANADIUM OXIDE FILMS AND METHODS OF FABRICATING THE SAME

FIELD

The present invention generally relates to vanadium oxide thin films that exhibit an insulator-metal transition (IMT) at characteristic temperatures and methods of fabricating vanadium oxide thin films. In particular, the present invention is related to methods of fabricating crystalline vanadium oxide thin films which are substrate independent and exhibit an insulator-metal transition (IMT) at a characteristic temperature.

BACKGROUND

Vanadium has eleven oxide phases, with the vanadium (IV) oxide ($VO_2$) phase presenting stimuli-dependent phase transitions that manifest as switchable electronic and optical features. Temperature as stimulus induces an insulator-to-metal transition (IMT) as the $VO_2$ crystals reorient from a monoclinic state (insulator phase) to a tetragonal arrangement (metallic phase). This insulator to metal transition is accompanied by a simultaneous change in optical properties making $VO_2$ a thermochromic material. In particular, $VO_2$ has an IMT near an electronics-compatible temperature of ~68° C., wherein the $VO_2$ changes from being transparent to nearly opaque at infrared (IR) wavelengths. As a result, the temperature-dependent transition in electrical and optical properties of $VO_2$ can be exploited for a range of applications such as smart windows, electro-optic modulators, memory devices, terahertz systems, thermal actuators, Mott transistors, strain sensors, and thermo/electrochromic layers, most of which are dependent, to some degree, on the degree of crystallinity of the $VO_2$ film.

Crystalline $VO_2$ films can be prepared by a number of methods including chemical vapour deposition (CVD) using aqueous precursors and pulse direct current (DC) magnetron sputtering using pure metallic vanadium targets. Other methods include radiofrequency (RF) sputtering and sol-gel synthesis methods. The interplay between the concentration of vanadium ions in the multiphase $VO_2$, and the role of film thickness, grain size distribution, and crystallinity of the $VO_2$ film renders the fabrication of crystalline $VO_2$ films using pulsed DC magnetron sputtering highly process-dependent and substrate-dependent. Current processes both require a specific substrate, such as crystalline sapphire, and high deposition temperatures in order to fabricate high quality crystalline $VO_2$ thin films, with the desired electrical and optical properties. Accordingly, these manufacturing restrictions hinder the potential application of $VO_2$ films.

The substrate temperature during the deposition of $VO_2$ films using pulsed DC magnetron sputtering on single crystalline silicon or crystalline sapphire substrates is generally from 400-600° C. The selection of a substrate temperature required to induce crystalline $VO_2$ formation is highly dependent on the substrate composition and crystallinity, and the temperature required to induce crystalline $VO_2$ formation varies significantly with substrate type. There is a need for alternative methods for fabricating crystalline $VO_2$ films on a broader range of substrate types.

It will be clearly understood that any reference to prior art does not constitute an admission that any of these documents forms part of the common general knowledge in the art.

SUMMARY OF THE INVENTION

Methods for fabricating a crystalline vanadium oxide ($VO_2$) film suitable for a broad range of substrates are presented. The method for fabricating a crystalline vanadium oxide ($VO_2$) film comprises deposition of an amorphous $VO_2$ film on a substrate, and a subsequent annealing step to crystallise the amorphous $VO_2$ film to a crystalline $VO_2$ film. An advantage of the methods for fabricating a crystalline $VO_2$ film according to at least some embodiments described herein is that the low temperature deposition step and subsequent post-deposition annealing step are effective in fabricating crystalline $VO_2$ films across a broad range of substrates. Additionally, the low temperature deposition step and subsequent post-deposition annealing step may advantageously provide a method for reproducibly fabricating high quality crystalline $VO_2$ films.

Accordingly, in one aspect, the present disclosure relates to a method for fabricating a crystalline vanadium oxide ($VO_2$) film comprising the steps of:
  a) depositing an amorphous $VO_2$ film on a substrate by pulsed DC magnetron sputtering using a vanadium target, wherein the substrate is exposed to a sputtering gas comprising an inert process gas and oxygen ($O_2$), and the substrate has a temperature of less than about 50° C.; and
  b) annealing the deposited amorphous $VO_2$ film to crystallise the amorphous $VO_2$ film into a crystalline $VO_2$ film that exhibits an insulator-metal transition.

In some embodiments, the annealing may be performed at a pressure in the range of about 20 Pa to about 50 Pa. For example, the pressure may be in the range of about 30 Pa to about 40 Pa. In a further example, the pressure may be about 33 Pa.

In another embodiment, the substrate temperature during deposition of the amorphous $VO_2$ may be greater than about 5° C. For example, the substrate temperature may be greater than about 10° C. In another example, the substrate temperature may be from about 20° C. to about 30° C. In a further example, the substrate temperature may be at an ambient temperature, such as room temperature.

In another embodiment, the inert process gas may be argon (Ar).

In another embodiment, the sputtering gas may have an $O_2$ molar concentration in Ar from about 20% to about 60%. For example, the sputtering gas may have an $O_2$ molar concentration in Ar of about 30%.

In another embodiment, the sputtering gas may be flowing with an $O_2$ flow rate of about 5.25 sccm and an Ar flow rate of about 12.25 sccm.

In another embodiment, the method for fabricating a crystalline vanadium oxide ($VO_2$) film as described above may further comprise evacuating a sputtering chamber to a base pressure of about $5.3 \times 10^{-5}$ Pa and wherein the pulsed DC magnetron sputtering may be performed while the sputtering gas is at a pressure of about $3.7 \times 10^{-1}$ Pa.

In another embodiment, the pulsed DC magnetron sputtering may have a sputtering power of about 200 W.

In another embodiment, the pulsed DC magnetron may be performed with a sputtering power of about 200 W, a pulse frequency of about 25 kHz, and a reverse time of about 5 µs.

In another embodiment, the substrate may be placed at a distance from the vanadium target in the range from about 5 cm to about 25 cm. For example, the substrate may be placed at a distance from the vanadium target from about 12 cm.

In another embodiment, the annealing may be at a temperature in the range from about 500° C. to about 570° C. In another embodiment, the annealing may be at a temperature of about 550° C.

In another embodiment, the annealing may be for a period of time from about 30 minutes to about 120 minutes. In another embodiment, the annealing may be for a period of time about 90 minutes.

In another embodiment, the substrate may be selected from the group consisting of glass, silicon and quartz.

In another embodiment, the deposited amorphous $VO_2$ film and/or the fabricated crystalline $VO_2$ film may have a thickness greater than about 50 nm. For example, the deposited amorphous $VO_2$ film and/or the fabricated crystalline $VO_2$ film may have a thickness of about 150 nm.

In another embodiment, the crystalline $VO_2$ film may exhibit an insulator-metal transition at a characteristic temperature from about 65° C. to about 75° C. In another embodiment, the crystalline $VO_2$ film may exhibit an insulator-metal transition at a temperature of about 69° C.

In another aspect, the present disclosure relates to a crystalline vanadium (IV) oxide film ($VO_2$) fabricated by the method according to any embodiments thereof as described herein.

In yet another aspect, the present disclosure relates to a crystalline vanadium-oxide ($VO_2$) film fabricated by a method comprising the steps of:

a) depositing an amorphous $VO_2$ film on a substrate by pulsed DC magnetron sputtering using a vanadium target, wherein the substrate is exposed to a sputtering gas comprising an inert process gas and oxygen ($O_2$), and the substrate has a temperature of less than about 50° C.; and b) annealing the deposited amorphous $VO_2$ film to crystallise the amorphous $VO_2$ film into a crystalline $VO_2$ film that exhibits an insulator-metal transition.

General Terms

Throughout this disclosure, unless specifically stated otherwise or the context requires otherwise, reference to a single step, composition of matter, group of steps or group of compositions of matter shall be taken to encompass one and a plurality (i.e. one or more) of those steps, compositions of matter, groups of steps or groups of compositions of matter. Thus, as used herein, the singular forms "a", "an" and "the" include plural aspects unless the context clearly dictates otherwise. For example, reference to "a" includes a single as well as two or more; reference to "an" includes a single as well as two or more; reference to "the" includes a single as well as two or more and so forth.

As used herein, the term "about", unless stated to the contrary, refers to +/−10%, more preferably +/−5%, more preferably +/−1%, of the designated value.

Those skilled in the art will appreciate that the disclosure herein is susceptible to variations and modifications other than those specifically described. It is to be understood that the disclosure includes all such variations and modifications. The disclosure also includes all of the steps, features, compositions and compounds referred to or indicated in this specification, individually or collectively, and any and all combinations or any two or more of said steps or features.

Each example of the present disclosure described herein is to be applied mutatis mutandis to each and every other example unless specifically stated otherwise. The present disclosure is not to be limited in scope by the specific examples described herein, which are intended for the purpose of exemplification only. Functionally-equivalent products, compositions and methods are clearly within the scope of the disclosure as described herein.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The term "consists of", or variations such as "consisting of", refers to the inclusion of any stated element, integer or step, or group of elements, integers or steps, that are recited in context with this term, and excludes any other element, integer or step, or group of elements, integers or steps, that are not recited in context with this term.

The term "molar concentration" described herein refers to the molar concentration (%) of an individual gas in a gas mixture, and is calculated by dividing the number of moles of an individual gas ($n_x$) by the total number of moles in a gas mixture ($n_{total}$), and converting it to a percentage. By way of example, where a sputtering gas comprises an argon (Ar) inert process gas and oxygen ($O_2$), the molar concentration (%) of $O_2$ is calculated by dividing the number of moles of $O_2$ ($n_{O2}$) by the total number of moles of $O_2$ and Ar ($n_{total}$), and converting it to a percentage.

The term "partial pressure" described herein refers to the partial pressure (%) of an individual gas in a gas mixture, and is calculated by dividing the partial pressure of an individual gas ($p_x$) by the total pressure of a gas mixture ($p_{total}$), and converting it to a percentage. By way of example, where a sputtering gas comprises an argon (Ar) inert process gas and oxygen ($O_2$), the partial pressure (%) of $O_2$ is calculated by dividing the partial pressure of $O_2$ ($p_{O2}$) by the total pressure of $O_2$ and Ar ($p_{total}$), and converting it to a percentage.

It will be understood that at any given total pressure of a gas mixture ($p_{total}$), the molar concentration of each individual gas can be used to determine the partial pressures of each individual gas ($p_x$) in a gas mixture. For example, where a sputtering gas comprises an argon (Ar) inert process gas and oxygen ($O_2$), the partial pressure of $O_2$ ($p_{O2}$) can be calculated by multiplying the total pressure ($p_{total}$) by the molar concentration of $O_2$. This relationship is summarised by the formula $p_x/p_{total}=n_x/n_{total}$.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the present specification, including definitions, will control. In addition, the materials, methods, and examples are illustrative only and not intended to be limiting.

BRIEF DESCRIPTION OF DRAWINGS

Embodiments are described in further detail below, by way of example, with reference to the accompanying drawings briefly described below:

FIG. 4a shows X-ray diffraction spectra of $VO_2$ films deposited on glass and silicon substrate pre- and post-annealing;

FIG. 4b is a Raman spectrum of post-deposition annealed crystalline $VO_2$ films;

FIG. 6b is an optical transmission spectrum from the $VO_2$ film of FIG. 6a;

FIG. 8b is an optical reflectance spectrum from the $VO_2$ film of FIG. 6a;

FIG. 10b is an optical reflectance spectrum from the $VO_2$ film of FIG. 6a;

FIG. 13b is a graph showing repeatability in resistivity values for various cycles in the insulator (30° C.) and metal (90° C.) states of the $VO_2$ film of FIG. 13a.

DETAILED DESCRIPTION

The present disclosure describes the following various non-limiting examples, which relate to investigations undertaken to identify alternative methods for fabricating crystalline vanadium oxide films. Methods for fabricating a crystalline vanadium oxide film suitable for a broad range of substrates are described herein. The methods for fabricating a crystalline vanadium oxide ($VO_2$) film comprise the deposition of an amorphous $VO_2$ film on a substrate, and a subsequent annealing step to crystallise the amorphous $VO_2$ film to a crystalline $VO_2$ film.

The present disclosure provides a method for fabricating a crystalline vanadium oxide ($VO_2$) film. In the fabricated crystalline $VO_2$ films of the present disclosure, vanadium is present in an oxidation state of +4, also referred to as vanadium (IV), or $V^{4+}$. The crystalline vanadium oxide films of the present disclosure comprise vanadium (IV) and oxygen, in the form of vanadium (IV) oxide ($VO_2$).

The method for fabricating a crystalline $VO_2$ film comprises a) a deposition step followed by b) an annealing step.

Pulsed DC Magnetron Sputtering System

Figure 1:
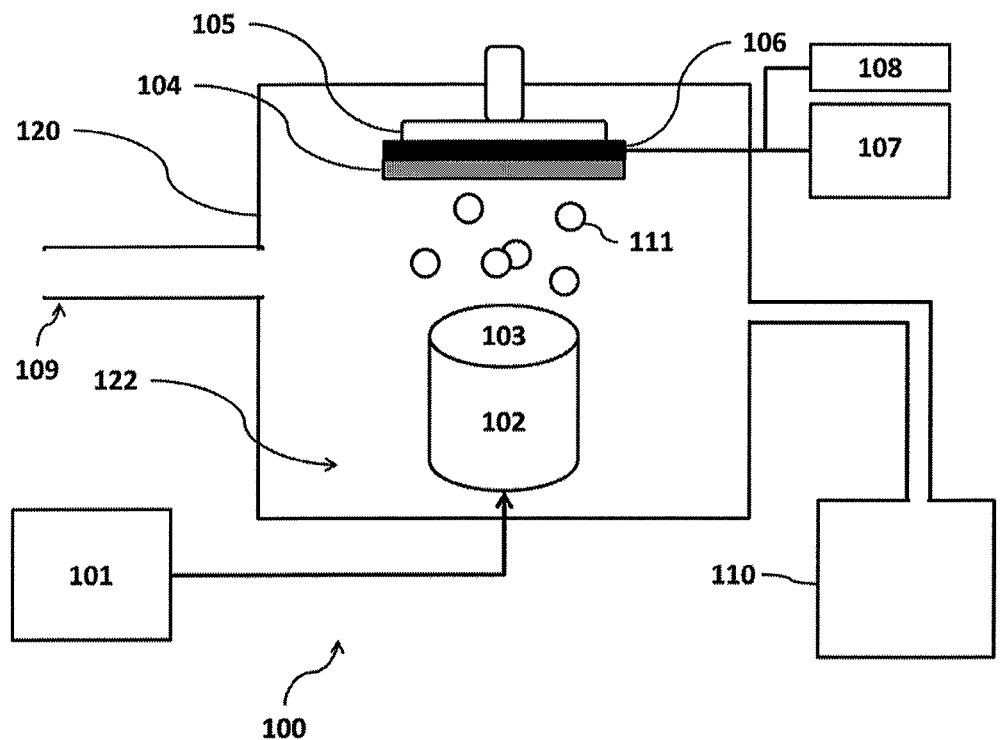
FIG. 1 is a block diagram of a pulsed DC magnetron sputtering setup.

The method for fabricating a crystalline vanadium oxide ($VO_2$) film may comprise the use of a pulsed DC magnetron sputtering system (100, FIG. 1). As used herein, the term "pulsed DC magnetron sputtering" refers to the process of depositing materials onto a substrate (104) utilising a strong magnetic field near the substrate (104). Unlike conventional DC magnetron sputtering, pulsed DC magnetron sputtering offers advantages such as higher target utilization, low target poisoning (introduction of impurities into the target) and increased ion energy and ion flux in the vicinity of the substrate (104) surface. The increased ion energy and ion flux obtained in the pulsed DC magnetron sputtering have profound influence on the composition, texture and properties of the deposited films. A detailed description of each of the features of the $VO_2$ film fabrication method using pulsed DC magnetron sputtering system in accordance with the present disclosure is provided further below.

Referring to FIG. 1, one example of a pulsed DC magnetron sputtering system (100) which may be used in the method for fabricating a crystalline vanadium oxide ($VO_2$) film is shown. In this example, the pulsed DC magnetron sputtering system (100) comprises a power supply (101) which supplies a DC voltage to the magnetron (102). The magnetron (102) houses a vanadium target (103). A substrate (104) is located at a predetermined distance from the vanadium target (103) and is housed on a rotating substrate holder (105). The pulsed DC magnetron sputtering system includes a body (120) that defines a sputtering chamber (122) in fluid communication with: a sputtering gas inlet (109) and a vacuum pump (110).

The substrate holder (105) may optionally comprise a substrate temperature control device (106), a substrate temperature controller (107) and a thermocouple (108) in contact with the substrate.

As used herein, the term "substrate" refers to a solid substance onto which a layer of another substance is applied, and to which that other substance adheres. The method of depositing an amorphous $VO_2$ film using pulsed DC magnetron sputtering is substrate independent. Accordingly, it will be understood that the method of fabricating an amorphous $VO_2$ film using pulsed DC magnetron sputtering is not limited to deposition on a specific substrate (104).

The substrate (104) may be crystalline or amorphous. In some embodiments, the substrate (104) may be amorphous.

In some embodiments the substrate (104) may be selected from the group consisting of glass, quartz, silicon, stainless steel, aluminium, ceramic, or reinforced plastic. In another embodiment, the substrate may be quartz, silicon or glass. In some embodiments the substrate may be silicon. In an alternative embodiment the substrate may be quartz. In yet another embodiment the substrate may be glass.

In some embodiments, the substrate (104) has a resistivity of at least 50 Ω·m. As disclosed herein, the term "vanadium target" will be understood to be the source of the vanadium ions used to fabricate the vanadium oxide films. The vanadium target (103) may have a purity of more than 99%. In some embodiments, the vanadium target (103) may have a purity of about 99.99%. In further embodiments, the vanadium target (103) may optionally be doped with an additional dopant metal selected from one or more of titanium, niobium, molybdenum, tungsten, rhodium, palladium or ruthenium, or mixtures thereof. The inclusion of metal dopants may be used to adjust the characteristic temperature (Tc) that IMT occurs.

Vanadium Oxide ($VO_2$) Film

Figures 2A, 2B:
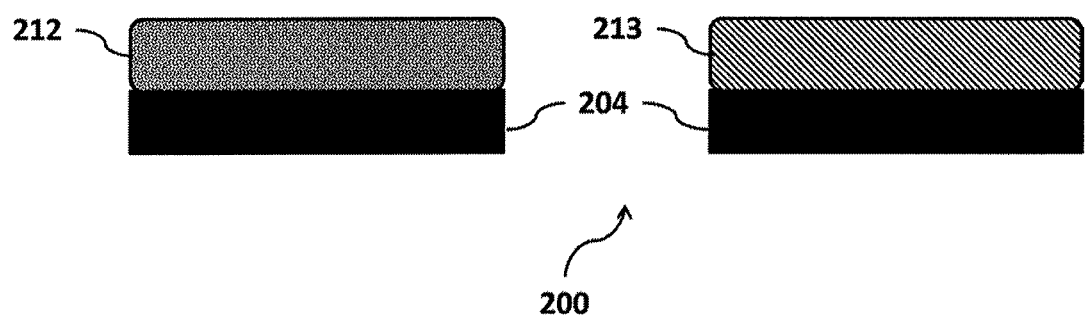
FIG. 2a is a cross-sectional side view of a deposited $VO_2$ film on a substrate pre-post-annealing.
FIG. 2b is a cross-sectional side view of the deposited $VO_2$ film of FIG. 2A post-annealing.

Referring to FIG. 2a, a cross-section of a coated panel (200) is shown. The coated panel (200) comprises an amorphous vanadium oxide ($VO_2$) film (212) deposited on a substrate (204). It will be understood that the as-deposited amorphous $VO_2$ films do not form a crystal lattice, and lacks the long-range order of a crystal lattice. In some cases, the amorphous vanadium oxide film (212) is also devoid of precursor crystals or nano-crystals which may not be detectable with techniques such as X-ray diffraction.

Referring to FIG. 2b, a cross-section of the coated panel (200) is shown comprising a crystalline vanadium oxide ($VO_2$) film (213) on a substrate (204). The crystalline vanadium oxide ($VO_2$) film (213) may include a plurality of crystal grains and therefore may be polycrystalline.

The term 'vanadium oxide ($VO_2$) film' (212, 213) is intended to mean a film comprising the presence of the vanadium (V) and oxygen ($O_2$), at least partially including $VO_2$ and preferably including at least 80% $VO_2$. The $VO_2$ may therefore also include one or more of trace impurities, dopants and concentrations of vanadium oxide in other configurations undetectable using X-ray photoelectron spectroscopy (XPS) and/or Raman spectroscopy.

The term 'crystalline vanadium oxide ($VO_2$) film' is intended to mean a film that has a corresponding X-ray diffraction spectrum showing crystalline peaks characteristic of $VO_2$.

Crystalline Vanadium Oxide Film Fabrication

The method for fabricating a crystalline vanadium oxide ($VO_2$) film (213) comprises the steps of:
a) depositing an amorphous $VO_2$ film (212) on a substrate (104, 204) by pulsed DC magnetron sputtering (100) using a vanadium target (103), wherein the substrate (104, 204) is exposed to a sputtering gas (111) comprising an inert process gas and oxygen ($O_2$); and
b) annealing the deposited amorphous $VO_2$ film (212) to crystallise the amorphous $VO_2$ film (212) into a crystalline $VO_2$ film (213) that exhibits an insulator-metal transition.

In preferred embodiments, the method for fabricating a crystalline vanadium oxide ($VO_2$) film (213) comprises the steps of:
a) depositing an amorphous $VO_2$ film on a substrate (104, 204) by pulsed DC magnetron sputtering (100) using a vanadium target (103), wherein the substrate (104, 204) is exposed to a sputtering gas (111) comprising an inert process gas and oxygen ($O_2$), and the substrate (104) has a temperature of less than about 50° C.; and
b) annealing the deposited amorphous $VO_2$ film (212) to crystallise the amorphous $VO_2$ film (212) into a crystalline $VO_2$ film (213) that exhibits an insulator-metal transition.

The substrate (104, 204) is not intentionally heated and, for deposition step a) the substrate (104, 204) has a low temperature of less than about 50° C. The substrate temperature may be a low temperature selected from less than about 50° C., 40° C., 30° C., 20° C. or 10° C. In some embodiments, the substrate temperature may be a low temperature selected from at least about 10° C., 20° C., 30° C. or 40° C. In a further embodiment, the substrate temperature may be at a low temperature selected from about 0° C. to 50° C., 5° C. to 45° C., 10° C. to 40° C., 15° C. to 35° C. or 20° C. to 30° C. In a further embodiment the low temperature of the substrate (104, 204) may be selected from about 20° C., 21° C., 22° C., 23° C., 24° C., 25° C., 26° C., 27° C., 28° C., 29° C. or 30° C.

In some embodiments, the substrate (104, 204) is cooled to maintain the substrate temperature less than about 50° C. The substrate (104, 204) may be cooled using the substrate temperature control device (106) and the substrate temperature controller (107). The low temperature of the substrate may be monitored and determined using the thermocouple (108) in contact with the substrate. It will be appreciated that any means of measuring temperature of solid surfaces are envisaged to be applicable to measure the substrate temperature.

In further embodiments, the substrate temperature is room temperature, which will be understood to be about 20° C. to about 25° C. In alternative embodiments, the substrate (104, 204) is at ambient temperature in relation to the surrounding environment of the DC magnetron sputtering system (100). It will be understood that an ambient substrate temperature may be obtained when no external heat or cooling is afforded to the substrate during the pulsed magnetron DC sputtering deposition of the amorphous $VO_2$ film (212). One advantage of depositing an amorphous $VO_2$ film (212) on a substrate (104, 204) is that a broad range of substrates may be used. A crystalline substrate is not required as a precursor for growth of a crystalline film and deposition can be performed at a temperature of less than 50° C., for example at room temperature. Additionally, the deposition method does not require heating the substrate which advantageously simplifies the method and enables deposition on large substrates which may be difficult to uniformly heat.

The pulsed DC magnetron sputtering may be performed while the oxygen-argon sputtering gas (111) is at a sputtering pressure of about $2.8 \times 10^{-3}$ Torr ($3.7 \times 10^{-1}$ Pa), and a base pressure of about $4 \times 10^{-7}$ Torr ($5.3 \times 10^{-5}$ Pa). In some embodiments, the pulsed DC magnetron sputtering has a sputtering power of about 200 W (with a DC voltage of about 445 V), a pulse frequency of about 25 kHz, and a reverse time of about 5 µs. Performing deposition with these sputtering parameters may provide further advantages including reduced formation of secondary phases (other than $VO_2$) in the deposited film which may occur if the power is too low, and poisoning of the vanadium target (for example with oxygen) that may occur if the power is too high. Reducing these effects advantageously provides a more efficient and reproducible method of fabricating crystalline vanadium oxide ($VO_2$) films.

Additionally, increasing base pressure may lead to growth of larger crystal sizes (while maintaining other parameters the same). Higher oxygen flow rates may also lead to growth of larger crystal sizes (while maintaining other parameters the same). Lower sputtering power is expected to result in thinner $VO_2$ films deposited and slower growth rates over the same deposition duration (while maintaining other parameters the same).

In some embodiments, the substrate (104, 204) may be placed at a distance from the vanadium target (103) from about 5 to 25 cm. For example, the substrate (104, 204) may be placed at a distance from the vanadium target (103) selected from about 5 to 25 cm, 8 to 20 cm or 10 to 15 cm. In other embodiments, the substrate (104, 204) is placed at a distance from the vanadium target (103) from about 11 to 13 cm, and may be selected from about 11.0 cm, 11.2 cm, 11.4 cm, 11.6 cm, 11.8 cm, 12.0 cm, 12.2 cm, 12.3 cm, 12.4 cm, 12.5 cm, 12.6 cm, 12.7 cm, 12.8 cm. 12.9 cm or 13.0 cm. In some embodiments, the substrate (104, 204) may be placed at a distance from the vanadium target (103) of about 12 cm. The substrate distance may alter the deposited $VO_2$ film thickness and growth rate.

The substrate (104, 204) may be cleaned prior to the deposition of the amorphous $VO_2$ film (212). In some embodiments, the substrate may be cleaned in an ultrasonic cleaning device or plasma-cleaned. In another embodiment, the substrate (104, 204) may be cleaned in an ultrasonic cleaning device and then subsequently plasma-cleaned. Alternatively, the substrate (104, 204) may not be cleaned prior to the deposition of the amorphous $VO_2$ film (212).

Further advantages may be provided by some of the above embodiments, and include that the substrate (104, 204) in accordance with the present disclosure may not be required to comprise a specific material and/or crystallinity in order to deposit the $VO_2$ film via pulsed DC magnetron sputtering. A further advantage may also include that the substrate (104, 204) is not required to be heated to high temperatures prior to or during the deposition of a $VO_2$ film. Accordingly, the method of depositing the amorphous $VO_2$ film (212) is suitable for a broad range of substrates (104, 204), which may be at low temperatures.

Sputtering Gas

As disclosed herein, the term "sputtering gas" refers to the gaseous environment which is inserted into the pulsed DC magnetron sputtering system (100) via the inlet (109) to expose the substrate (104, 204) to during deposition of $VO_2$ films.

In some embodiments, the sputtering gas (111) includes an inert process gas, for example argon (Ar), and a reactive gas, oxygen ($O_2$). In one embodiment, the sputtering gas (111) comprises an inert process gas and oxygen ($O_2$). In some embodiments, the inert process gas may be selected from an inert gas such as argon, helium, or relatively non-reactive nitrogen ($N_2$) or mixtures of two or more thereof. The $O_2$ reactive gas reacts with the vanadium ions produced from the target (103) either in a gaseous state or once deposited onto the substrate (104, 204) to form the amorphous $VO_2$ film (212) on the substrate (104, 204), while the inert Ar process gas provides an inert environment for the reactive sputtering, plasma ignition and metal bombardments.

In some embodiments, the sputtering gas (111) may have an $O_2$ molar concentration (partial pressure) in Ar from about 20% to about 60%. In some embodiments, the sputtering gas (111) may have an $O_2$ molar concentration in Ar selected from at least about 20%, 30%, 40%, 50% or 60%. In another embodiment, the sputtering gas (111) may have an $O_2$ molar concentration in Ar selected from less than about 60%, 50%, 40%, 30% or 20%. In some embodiments, the sputtering gas (111) may have an $O_2$ molar concentration in Ar of from about 20 to 60%, 22 to 50%, 25 to 50%, 24 to 40%, 26 to 36% or 28 to 32%. In a further embodiment, the sputtering gas (111) may have an $O_2$ molar concentration in Ar of about 30%. In an alternative embodiment, the sputtering gas (111) may have an $O_2$ molar concentration in Ar of about 50%.

In some embodiments, the sputtering gas (111) substantially consists of argon (Ar) and oxygen ($O_2$). In some embodiments, the sputtering gas (111) comprises argon (Ar) and oxygen ($O_2$) with less than 1% molar concentration of other gases.

In some embodiments, the substrate (104, 204) is exposed to a flowing sputtering gas (111). The flowing sputtering gas (111) may have an $O_2$ flow rate of about 5.25 sccm and an Ar flow rate of about 12.25 sccm.

In some embodiments, the sputtering gas (111) may have an $O_2$ flow rate selected from about 4 to 9 sccm, and may have an Ar flow rate selected from of about 8 to 13 sccm. In some embodiments, the sputtering gas (111) may have an $O_2$ flow rate selected from at least about 4 sccm, 5 sccm, 6 sccm, 7 sccm, 8 sccm or 9 sccm, and may have an Ar flow rate selected from at least about 8 sccm, 9 sccm, 10 sccm, 11 sccm, 12 sccm or 13 sccm. The sputtering gas (111) may have an $O_2$ flow rate of about 4.28 sccm and an Ar flow rate of about 12.82 sccm. In another embodiment, the sputtering gas (111) may have an $O_2$ flow rate of about 6.08 sccm and an Ar flow rate of about 11.27 sccm. In another embodiment, the sputtering gas (111) may have an $O_2$ flow rate of about 7.01 sccm and an Ar flow rate of 10.5 sccm. In another embodiment, the sputtering gas (111) may have an $O_2$ flow rate of about 7.95 sccm and an Ar flow rate of about 9.7 sccm. In a further embodiment, the sputtering gas (111) may have an $O_2$ flow rate of about or 8.89 sccm and an Ar flow rate of about 8.88 sccm.

Further advantages may be provided by some of the above embodiments, wherein the sputtering gas (111) in accordance with the present disclosure provides $O_2$ in an amount effective to form an amorphous $VO_2$ film (212), and may minimize the presence of other phases of vanadium oxide.

Deposition Duration

The depositing of an amorphous $VO_2$ film (212) may occur for a deposition time effective to form an amorphous $VO_2$ film of a defined thickness on the substrate (104, 204). In some embodiments, the deposition time may be selected from about 15 minutes (min) to about 60 min. In a further embodiment, the deposition time may be selected from about 10 min to 80 min, 20 min to 70 min, 30 min to 60 min, or 40 to 50 min. In some embodiments, the deposition time may be selected from at least about 15 min, 20 min, 25 min, 30 min, 35 min, 40 min, 45 min, 50 min, 55 min or 60 min. In yet another embodiment, the deposition time may selected from about 15 min, 30 min, or 45 min. In a further embodiment, the deposition time may be about 45 min.

Further advantages may be provided by some of the above embodiments, wherein the deposition duration in accordance with the present disclosure advantageously provides a predetermined amorphous $VO_2$ film (212) thickness.

In some embodiments, the deposition of an amorphous $VO_2$ film (212) on a substrate (104, 204) by pulsed DC magnetron sputtering may have a sputtering pressure of about $2.8 \times 10^{-3}$ Torr ($3.7 \times 10^{-1}$ Pa), a base pressure of about $4 \times 10^{-7}$ Torr ($5.3 \times 10^{-5}$ Pa), may have a sputtering power of about 200 W, may have a pulse frequency of about 25 kHz, may have a reverse time of about 5 μs; may have a substrate temperature of about room temperature (i.e. about 20° C. to about 25° C.), may have a substrate (104, 204) placed at a distance from the vanadium target (103) of about 12 cm; may have a sputtering gas (111) having an $O_2$ molar concentration in Ar of about 30%, may have an $O_2$ flow rate of about 5.25 sccm and may have an Ar flow rate of about 12.25 sccm.

Lower sputtering power is expected to result in thinner $VO_2$ films deposited and slower growth rates over the same deposition duration.

The as-deposited amorphous $VO_2$ film (212) may have a vanadium oxidation state of $V^{4+}$, which can be determined using X-ray photoelectron spectroscopic (XPS) analysis.

In some embodiments, the film thickness of the amorphous $VO_2$ film (212) refers to the height of the deposited amorphous $VO_2$ film (212) on the substrate. Referring to FIG. 2, the thickness of a deposited amorphous $VO_2$ film (212) is depicted as a cross-section in relation to the substrate (204).

The deposited amorphous $VO_2$ film (212) may have a film thickness selected from about 10 nm to about 200 nm. In some embodiments, the deposited amorphous $VO_2$ film (212) may have a film thickness selected from at least about 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, or 200 nm. In yet another embodiment, the deposited amorphous $VO_2$ film may have a film thickness selected from less than about 200 nm, 190 nm, 180 nm, 170 nm, 160 nm, 150 nm, 140 nm, 130 nm, 120 nm, 110 nm, 90 nm, 80 nm, 70 nm, 60 nm, 50 nm, 40 nm, 30 nm, 20 nm or 10 nm.

In a further embodiment, the deposited amorphous $VO_2$ film (212) may have a film thickness of about 150 nm, which may be achieved using a sputtering gas having an $O_2$ molar concentration in Ar of about 30%, and a deposition time of about 45 minutes, as defined above. The deposited amorphous $VO_2$ film (212) thickness may be measured by conventional techniques, such as, for example, scanning electron microscopy (SEM) or stylus profilometry (Dektak XT, Bruker). In some embodiments, the deposited amorphous film thickness may be measured by stylus profilometry (Dektak XT, Bruker).

Annealing the Deposited Amorphous Vanadium Oxide Film

Annealing the deposited amorphous $VO_2$ film (212) in step b) crystallises the amorphous $VO_2$ film (212) into the crystalline $VO_2$ film (213). As used herein, the term "annealing" refers to the process of heating the amorphous $VO_2$ film to a temperature effective to crystallise amorphous $VO_2$ into crystalline $VO_2$. As discussed above, it has been found that subsequent post-deposition annealing step of the deposited amorphous $VO_2$ film (212) has been found to be effective in controllably fabricating crystalline $VO_2$ films (213) on a broad range of substrates.

Annealing the amorphous $VO_2$ film (212) after deposition may be also be advantageous over high temperature growth of crystalline $VO_2$ films (213) as it may be easier or more efficient to heat large area films in, for example, a furnace than to heat the same large area substrate (104, 204) in a sputtering chamber (122). This may be particularly useful if fabricating crystalline $VO_2$ films (213) on large glass window panels. Additionally, annealing after deposition also advantageously enables a plurality of amorphous $VO_2$ film (212) to be batch processed and annealed at the same time.

Annealing of the amorphous $VO_2$ film (212) may be performed using a vacuum furnace (not shown) suitable for low-vacuum operation.

The annealing is performed while the amorphous film (212) is exposed to a pressure ('annealing pressure') less than room pressure (760 Torr, 1 atm, 101 kPa). In some embodiments, the annealing pressure may be in the range of about 150 mTorr (20 Pa) to about 375 mTorr (50 Pa). In another embodiment, the annealing pressure may be in the range of about 225 mTorr (30 Pa) to about 300 mTorr (40 Pa). In a further embodiment, the annealing pressure may be about 250 mTorr (33 Pa).

In another embodiment, the annealing pressure may be selected from less than about 375 mTorr (50 Pa), 300 mTorr (40 Pa), 225 mTorr (30 Pa), or 150 mTorr (20 Pa). In a further embodiment, the annealing pressure may be selected from about 150 mTorr (20 Pa) to 375 mTorr (50 Pa), 188 mTorr (25 Pa) to 336 mTorr (45 Pa), or 225 mTorr (30 Pa) to 300 mTorr (40 Pa). In a further embodiment, the annealing pressure may be selected from about 225 mTorr (30 Pa), 233 mTorr (31, Pa), 240 mTorr (32 Pa), 248 mTorr (33 Pa), 255 mTorr (34 Pa), 263 mTorr (35 Pa), 270 mTorr (36 Pa), 278 mTorr (37 Pa), 285 mTorr (38 Pa), 293 mTorr (39 Pa) or 300 mTorr (40 Pa). In yet another embodiment, the annealing pressure may be about 248 mTorr (33 Pa). In yet a further embodiment, the annealing pressure may be about 250 mTorr (33.3 Pa).

An annealing pressure in the range of about 150 mTorr (20 Pa) to about 375 mTorr (50 Pa) may be described as a low-vacuum. Examples of a low-vacuum system suitable for use to obtain pressures lower than room pressure may include a vacuum pump (110) such as a rotary-vane 'roughing' pump, and in-house plumbed vacuum line connected to a vacuum pump (110).

Advantageously, annealing at a low-vacuum enables the number of oxygen vacancies formed in the crystalline $VO_2$ film (213) and the final crystal size of the crystalline $VO_2$ film (213) to be controlled compared to growing crystalline $VO_2$ films (213) on high temperature substrates. This may be the result of low-vacuum annealing of the amorphous $VO_2$ film (212) leading to a decrease in the rate of oxygen loss from the $VO_2$ thin film during the annealing compared to annealing at high vacuum. This advantageously results in a high quality fabricated crystalline $VO_2$ film (213) with a consistent composition and stoichiometry. Control of oxygen vacancy concentrations may, for example, be of particular importance for applications in data storage devices.

As disclosed herein, the temperature of the annealing step is a temperature effective to crystallise the amorphous $VO_2$ film (212) into a crystalline $VO_2$ film (213).

In some embodiments, the temperature of the annealing step may be in the range from about 400° C. to about 700° C. In some embodiments, the temperature of the annealing step may be selected from about 400° C. to 700° C., 350° C. to 680° C., 400° C. to 640° C., 450° C. to 600° C., 500 to 570° C. In another embodiment, the temperature of the annealing step may be selected from about 530° C. to about 570° C. In another embodiment, the temperature of the annealing step may be selected from about 500° C., 510° C., 520° C., 530° C., 540° C., 550° C., 560° C., 570° C. 580° C., 590° C. or 600° C. In a further embodiment, the temperature of the annealing step may be selected from about 540° C., 541° C., 542° C., 543° C., 544° C., 545° C., 546° C., 547° C., 548° C., 549° C., 550° C., 551° C., 552° C., 553° C., 554° C., 555° C., 556° C., 557° C., 558° C., 559° C. or 560° C. In a further embodiment, the temperature of the annealing step may be about 550° C.

The annealing step is performed over a period of time effective to crystallise the amorphous $VO_2$ film (212) into a crystalline $VO_2$ film (213). In some embodiments the annealing step may be over a period of time selected from about 30 minutes (min) to about 120 min. In an embodiment, the annealing step may be for a period of time selected from about 30 min to 120 min, 60 min to 110 min, or 80 min to 100 min. In a further embodiment, the annealing step may be for a period of time selected from about 80 min, 82 min, 84 min, 86 min, 88 min, 90 min, 92 min, 94 min, 96 min, 98 min or 100 min. In a further embodiment, the annealing step may be for a period of time selected from about 85 min, 86 min, 87 min, 87 min, 88 min, 89 min, 90 min, 91 min, 92 min, 93 min, 94 min or 95 min. In yet another embodiment, the annealing step may be for a period of time of at least 90 min. In a further embodiment, the annealing step may be for a period of time of about 90 min.

In some embodiments, the annealing of the deposited amorphous $VO_2$ film (212) to crystallise the amorphous $VO_2$ film (212) into a crystalline $VO_2$ film (213) may be at a pressure of about 250 mTorr (33.3 Pa), may be at a temperature of about 550° C., and may be for a period of time of about 90 min.

The annealed $VO_2$ films obtained in step b) are crystalline. It will therefore be understood that the crystalline $VO_2$ films (213) may show the characteristics of a crystal lattice with a highly ordered microscopic structure and long range order. The crystallinity of the crystalline $VO_2$ film (213) may be characterised using conventional techniques known to the person skilled in the art. Such techniques may include X-ray diffraction (XRD) and electron microscopy analysis such as selected area electron diffraction (SAED). The crystalline $VO_2$ film (213) may show a diffraction peak characteristic of diffraction from the (011) planes for crystalline $VO_2$.

The crystalline $VO_2$ film (213) has a vanadium oxidation state of $V^{4+}$, which can be determined using XPS analysis.

In some embodiments, the film thickness of the crystalline $VO_2$ film (213) refers to the height of the crystalline $VO_2$ film (213) on the substrate (204). Referring to FIG. 2, the thickness of the crystalline $VO_2$ film (213) depicted as a cross-section in relation to the substrate at (204).

The crystalline $VO_2$ film (213) may have about the same film thickness as the deposited amorphous $VO_2$ film (212).

For example, in some embodiments, the crystalline $VO_2$ film (213) may have a film thickness selected from about 10 nm to about 200 nm. In some embodiments, the crystalline $VO_2$ film (213) may have a film thickness selected from at least about 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, or 200 nm. In yet another embodiment, the crystalline $VO_2$ film (213) may have a film thickness selected from less than about 200 nm, 190 nm, 180 nm, 170 nm, 160 nm, 150 nm, 140 nm, 130 nm, 120 nm, 110 nm, 90 nm, 80 nm, 70 nm, 60 nm, 50 nm, 40 nm, 30 nm, 20 nm or 10 nm.

In a further embodiment, the crystalline $VO_2$ film (213) may have a film thickness of about 150 nm, which is achieved using a sputtering gas having an $O_2$ molar concentration in Ar of about 30%, and a deposition time of about 45 minutes. Advantageously, in one embodiment, a crystalline $VO_2$ film (213) thickness of about 150 nm may provide an IMT at a characteristic temperature. The IMT is discussed in further detail below.

The crystalline $VO_2$ film (213) thickness may be measured by scanning electron microscopy or stylus profilometry (Dektak XT, Bruker). In some embodiments, the crystalline $VO_2$ film (213) may be measured by stylus profilometry (Dektak XT, Bruker).

Insulator-Metal Transition (IMT)

As previously mentioned, it will be appreciated that an insulator-metal transition (IMT) occurs when temperature acts as a stimulus to induce a crystal reorientation from a monoclinic state (insulating phase) to a tetragonal arrangement (metallic phase). It is understood that the most effective transition switching occurs between the insulating phase and the metallic phase across the {011} directions of the monoclinic structure of crystalline $VO_2$.

In some embodiments, the crystalline $VO_2$ film (213) may have an IMT at a characteristic temperature (Tc). In one embodiment, the characteristic temperature may be in the range from about 65° C. to about 75° C. For example, referring to FIG. 6a, the crystalline $VO_2$ films (213) may have an IMT characteristic temperature of about ~69° C.

It will be understood that this electrical transition is accompanied by a simultaneous change in the optical properties. At the characteristic temperature that the crystalline $VO_2$ film (213) undergoes an IMT, there may also be a transition between a high optical transmission state and a low optical transmission state. For example, referring to FIGS. 6b, 8b and 10b, the crystalline $VO_2$ films (213) may transition from being transparent to nearly opaque, at infrared (IR) wavelengths, when the temperature increases above the characteristic temperature. The crystalline $VO_2$ film (213) may also transition from nearly opaque to transparent, at infrared (IR) wavelengths, when the temperature decreases below the characteristic temperature.

The ability for the crystalline $VO_2$ film (213) to change optical characteristics may be advantageously exploited in applications such as 'smart windows' for buildings. As optical transmission is reduced at higher temperatures, windows coated with crystalline $VO_2$ film (213) may autonomously transition to reduce IR transmission when heated by sunlight above the characteristic temperature.

In further embodiments, the crystalline $VO_2$ film (213) may have an observed IMT where the resistivity reversibly changes by about three to four orders of magnitude in resistive switching. This advantageously large change in resistivity may be exploited in electronic devices such as resistive data storage devices ('memristors').

In another embodiment, the crystalline $VO_2$ film (213) may have a switching ratio $R_{30}/R_{90}$ from about 200 to about 3000. The switching ratio $R_{30}/R_{90}$ is the ratio of the resistivity of the crystalline $VO_2$ film at 30° C. divided by the resistivity of the crystalline $VO_2$ film at 90° C. The switching ratio provides a quantitative measure of how the resistivity changes before and after an IMT. In one embodiment, the fabricated crystalline $VO_2$ film may have a switching ratio $R_{30}/R_{90}$ of selected from about 200 to 3000, 800 to 2900, 1200 to 2800, 1800 to 2700, or 2200 to 2500.

In another embodiment, the crystalline $VO_2$ film (213) may have a switching ratio $R_{30}/R_{90}$ of from about 2200 to 2500, 2250 to 2450, or 300 to 2400. In a further embodiment, the crystalline $VO_2$ film (213) may have a switching ratio $R_{30}/R_{90}$ of about 2300. It will be appreciated that the higher the switching ratio, the greater the effect of the IMT.

Thicker crystalline $VO_2$ films (213) may advantageously have a higher switching ratio than thinner crystalline $VO_2$ films (213).

In another embodiment, the properties of the crystalline $VO_2$ films (213) may be independent of the substrate (104, 204) the film is deposited on.

In another embodiment, the IMT may be reversible and repeatable. For example, referring to FIG. 13, the crystalline $VO_2$ films (213) shows near identical behaviour between cycle 1 and cycle 5 of the films being heated and allowed to cool down continuously.

In an exemplary embodiment, the deposition of an amorphous $VO_2$ film (212) on a substrate (104, 204) by pulsed DC magnetron sputtering (100) is performed at a sputtering pressure of about $2.8 \times 10^{-3}$ Torr ($3.7 \times 10^{-1}$ Pa), a base pressure of about $4 \times 10^{-7}$ Torr ($5.3 \times 10^{-5}$ Pa), a sputtering power of about 200 W, a pulse frequency of about 25 kHz, a reverse time of about 5 μs; may have a substrate temperature of about room temperature (i.e. about 20° C. to about 25° C.), a substrate (104, 204) placed at a distance from the vanadium target (103) from about 12 cm; a sputtering gas (111) having an $O_2$ molar concentration in Ar of about 30%, may have an $O_2$ flow rate of about 5.25 sccm and an Ar flow rate of about 12.25 sccm, and the subsequent annealing of the deposited amorphous $VO_2$ film (212) to crystallise the amorphous $VO_2$ film (212) into a crystalline $VO_2$ film at a pressure of about 250 mTorr (33.3 Pa), a temperature of about 550° C., and for a period of time of about 90 min results in a crystalline $VO_2$ film (213) with optimal IMT properties.

Many modifications of examples set forth herein will come to mind to one skilled in the art to which the present disclosure pertains having the benefit of the teachings presented in the foregoing descriptions and the associated drawings and figures. Therefore, it is to be understood that the present disclosure is not to be limited to the specific examples illustrated and that modifications and other examples are intended to be included within the scope of the appended claims. Moreover, although the foregoing description and the associated drawings and figures describe examples of the present disclosure in the context of certain illustrative combinations of elements and/or functions, it should be appreciated that different combinations of elements and/or functions may be provided by alternative implementations without departing from the scope of the appended claims.

EXAMPLES

The present disclosure is further described by the following examples. It is to be understood that the following description is for the purpose of describing particular embodiments only and is not intended to be limiting with respect to the above description.

Materials and Analysis
Spectroscopy and Microanalysis

X-ray photoelectron spectroscopy (XPS) analysis is conducted using a Thermo Scientific K-Alpha instrument under ultrahigh vacuum (base pressure <1×10$^{-7}$ Pa). An aluminium Kα X-ray radiation source with energy of 1486.6 eV is used. All core-level spectra of the elements are collected at pass energy of 50 eV and analysed with Avantage software. The binding energies of all principal elements are referenced to the adventitious carbon (C 1s) of binding energy 284.6 eV. Crystallography is verified using an X-ray diffraction powder analyser (D2 Phaser, Bruker). Deposited film thicknesses were measured by stylus profilometry (Dektak XT, Bruker). A Dimension Icon atomic force microscope was used to obtain surface topography. Raman spectra were obtained using a Horiba LabRAM Evolution micro-Raman system equipped with 532 nm laser (0.5 μm lateral resolution, 2 s exposure) and a 50× objective.

Insulator-to-Metal Transition Measurements

Electrical measurements were conducted using a Jandel cylindrical four-point probe. UV-Vis-IR transmission and reflection spectra are collected using a CRAIC 20/30 microspectrophotometer. A Linkam stage is used for heating and cooling of the sample during the electrical and optical measurements. The ramp-up and ramp-down rates are controlled at 5° C./min while measurements are collected.

Example 1

Deposited Amorphous VO$_2$ Film

Vanadium oxide VO$_2$ thin films were deposited onto plasma-cleaned glass, silicon, and quartz substrates using the pulsed DC magnetron sputtering technique at a DC voltage of about 445 V. Detailed parameters used for thin film deposition are shown in Table 1.

TABLE 1

| | |
|---|---|
| Target used | Vanadium (99.99%) |
| Distance from the target | ~12 cm |
| Base pressure | 4 × 10$^{-7}$ Torr |
| Sputtering pressure | 2.8 × 10$^{-3}$ Torr |
| Ar flow rate | 12.25 sccm |
| O$_2$ flow rate | 5.25 sccm |

TABLE 1-continued

| | |
|---|---|
| O$_2$ molar concentration in Ar (%) | 30% or 50% |
| Sputtering power | 200 W |
| Pulse frequency | 25 kHz |
| Reverse time | 5 μs |
| Substrate temperature | Room Temperature. (about 25° C.) |
| Deposition time | 15 min, 30 min or 45 min. |

A summary of the film thicknesses obtained using the above parameters is outlined below in Table 2.

TABLE 2

| O$_2$ molar concentration in Ar (%) | Duration (min) | Film thickness (nm) |
|---|---|---|
| 30 | 15 | 50.4 |
| 30 | 30 | 100.8 |
| 30 | 45 | 151.2 |
| 50 | 15 | 31.5 |
| 50 | 30 | 63.0 |
| 50 | 45 | 94.5 |

As can be seen, the film thickness increased as the deposition duration time increased. The thickest film of 151.2 nm was observed after a deposition time of 45 minutes with an oxygen molar concentration of 30%. All analyses and characterisation discussed herein pertain to the films the VO$_2$ thin films sputtered with 30% O$_2$ in an Ar and O$_2$ gas mixture for 45 min.

Figure 3A:
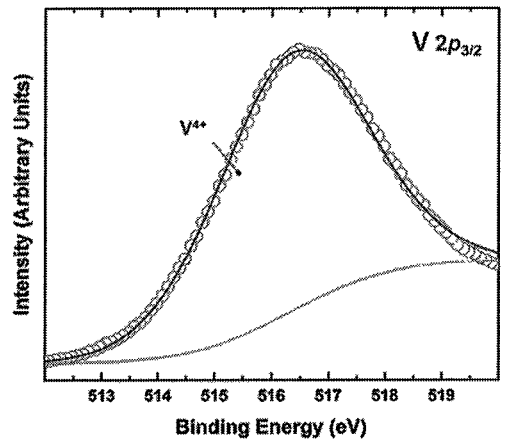
FIGS. 3a-3d are core-level X-ray photoelectron spectroscopic (XPS) spectra of a) V $2p_{3/2}$ and b) O 1s collected from as-deposited amorphous $VO_2$ films deposited on a glass substrate, and the subsequent c) V $2p_{3/2}$ and d) O 1s spectra collected from crystalline $VO_2$ thin films that were annealed after deposition on a glass substrate.
Figure 3B:
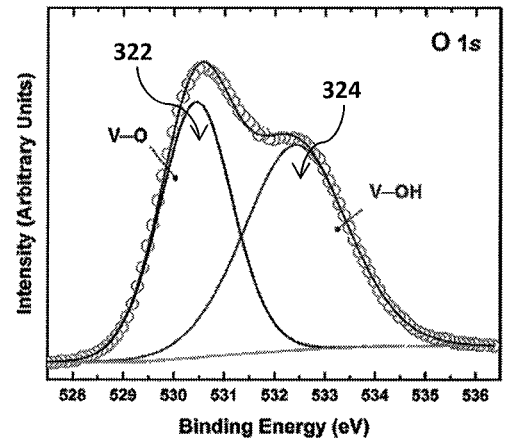
Figure 3C:
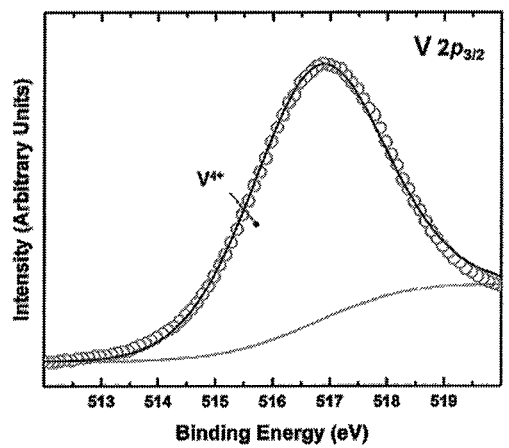
Figure 3D:
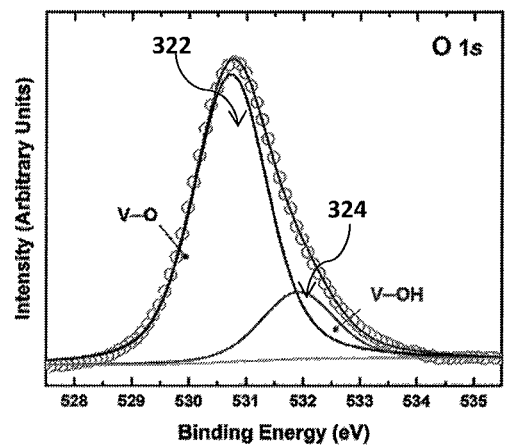

X-ray photoelectron spectroscopic (XPS) analysis of the amorphous VO$_2$ film deposited on a glass substrate shows the oxidation state of vanadium is V$^{4+}$ (see 322 and 324, FIGS. 3c and 3d in relation to glass substrates). The same oxidation state was observed on amorphous VO$_2$ films deposited on the other substrates.

X-ray diffraction spectra of the amorphous VO$_2$ film deposited on a glass and silicon substrates did not show sharp diffraction peaks, indicating that the as-deposited films are amorphous (602) with no long-range lattice arrangement observed (see FIG. 4a).

Figure 5A:
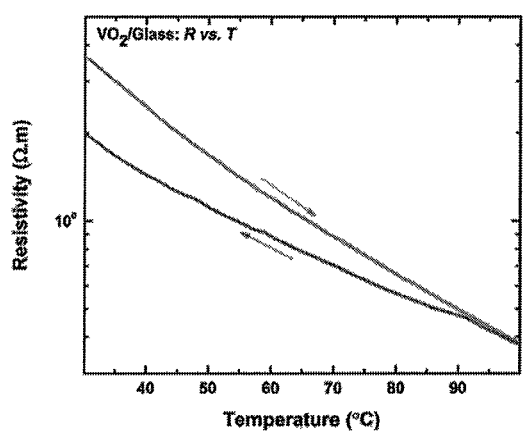
FIG. 5a is a graph of resistivity vs. temperature from as-deposited amorphous $VO_2$ thin films.
Figure 5B:
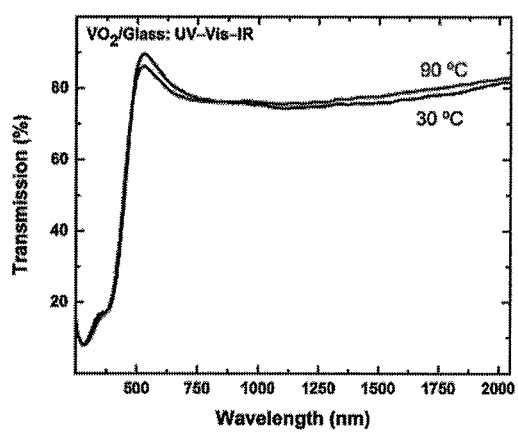
FIG. 5b is an optical transmission spectrum from as-deposited amorphous $VO_2$ thin films of FIG. 5a at 30° C. and 90° C.

FIGS. 5a and 5b outline the electrical and optical properties of the deposited amorphous VO$_2$ films. FIG. 5b shows the transmission of the amorphous VO$_2$ at both 30° C. and 90° C. are essentially identical, indicating no IMT or thermochromism observed in the infrared region of the optical spectra, as opposed to the crystalline VO$_2$ film, where the film changes from being transparent to nearly opaque at infrared (IR) wavelengths at an electronics-compatible temperature of ~69° C. (discussed below).

Example 2

Annealing of the Deposited Amorphous VO$_2$ Film

The as-deposited VO$_2$ films of Example 1 were placed in a furnace, which was evacuated to low vacuum to achieve a pressure of about 250 mTorr, and then annealed at a temperature of about 550° C. for 90 mins.

X-ray photoelectron spectroscopic (XPS) analysis of the crystalline VO$_2$ film shows the oxidation state of vanadium is V$^{4+}$ (see FIGS. 3a and 3b). As can be observed, high resolution XPS spectra of V $2_{p3/2}$ and O $1_s$ collected from the post-deposition annealed thin film. The V $2_{p3/2}$ spectrum in FIG. 3a shows a single peak centred at 516.4 eV which corresponds to V$^{4+}$ oxidation state. The O $1_s$ spectrum in FIG. 3b can be fitted with two components (322, 324) with peak positions at 530.4 eV and 532.4 eV attributed to V-O and V-OH, respectively. The combination of the V and O oxidation states confirms the presence of the VO$_2$ phase exclusively, given only the V$^{4+}$ oxidation state is observed. As the composition of the annealed crystalline VO$_2$ film does not show any difference in the oxidation state of vanadium (i.e. V$^{4+}$) as compared to the as-deposited amorphous VO$_2$, this indicates that annealing only changes the crystallinity of the films without affecting the chemical composition of the sputtered vanadium oxide.

X-ray diffraction spectra of the crystalline VO$_2$ film deposited on glass and silicon substrates show a sharp diffraction peak (601) at a 2θ of about 27.9°, which is characteristic of diffraction from the (011) planes of crystalline VO$_2$ (see FIG. 4*a*).

Raman spectroscopy verifies the phase of the crystalline VO$_2$ film on glass (see FIG. 4*b*). Peaks can be observed at wavenumbers of: 143, 195, 264, 300, 395, 443, 454, 488, 499, 615, and 695 cm$^{-1}$. These can be assigned to and labelled as Ag and Bg phonon vibration modes of VO$_2$, therefore confirming the stoichiometry of the film as only VO$_2$.

Figure 6A:
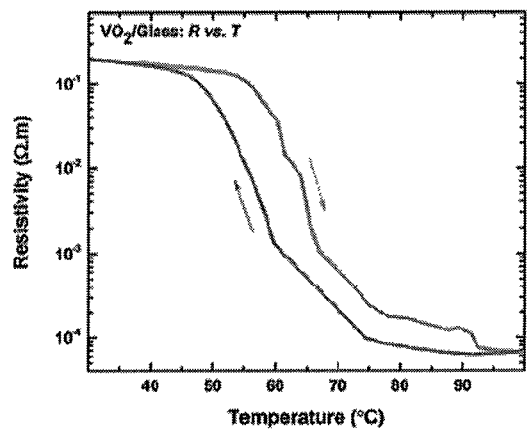
FIG. 6a is a graph of resistivity vs. temperature showing IMT from a $VO_2$ film fabricated by annealing after deposition on glass substrate.

The electrical resistivity of the crystalline VO$_2$ films using the four-point probe technique was investigated. The temperature-dependent resistivity of the crystalline VO$_2$ thin films on glass substrates (deposited at 30% O$_2$:Ar molar concentration for 45 min) is shown in FIG. 6*a*. FIG. 6*a* shows a drop in resistivity of four orders of magnitude at a temperature of about 69° C. The amplitude of the IMT is obtained from the resistivity ratio (R$_{90}$/R$_{30}$) at temperatures of 90° C. and 30° C., respectively. An obvious thermal hysteresis is also observed between the heating and cooling cycles.

Figure 6B:
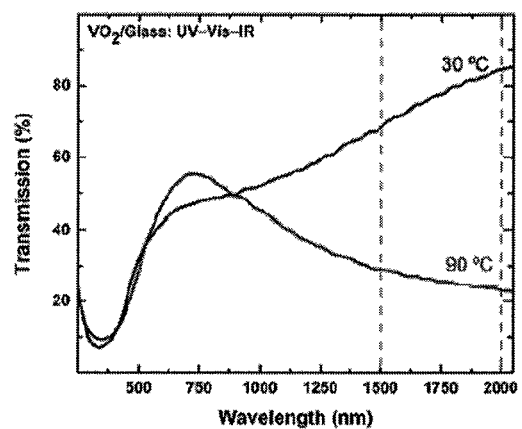

FIG. 6*b* shows a comparison of the optical transmission of a VO$_2$ thin film on glass substrate at 30° C. and 90° C. across the ultra-violet, visible, and infrared spectrum (UV-Vis-IR spectroscopy). While the change in the visible range is not significant, the discrimination between the 'insulator' (transparent) and 'metal' (opaque) states for higher wavelengths is apparent. This agrees with known thermochromic near-IR characteristics of VO$_2$.

Figure 7A:
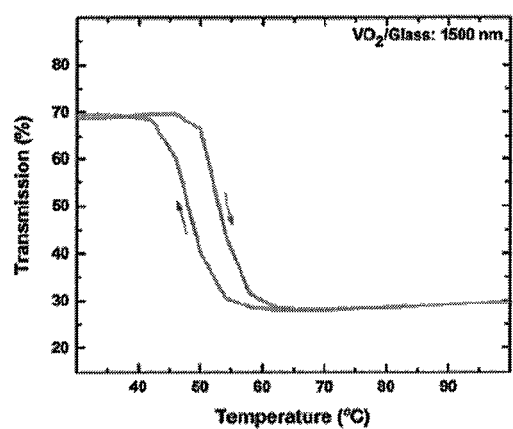
FIGS. 7a and 7b are optical transmission vs temperature graphs for a crystalline $VO_2$ film fabricated by annealing after deposition on glass substrate at an optical wavelength of: a) 1500 nm and b) 2000 nm.
Figure 7B:
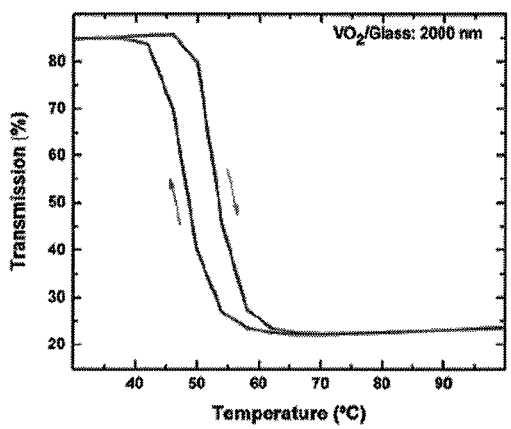

Temperature-dependent (both heating and cooling cycles) transmission spectra are obtained at two infrared wavelengths of 1500 and 2000 nm and are shown in FIGS. 7*c* and 7*d*, respectively. A significant change in the infrared transmittance can be observed throughout the temperature band where the IMT occurs. From a transmittance of ~70% at 30° C. (insulating phase), the value drops to below 28% and 5% at 90° C. (metallic phase) for 1500 and 2000 nm, respectively. This further elucidates that the optical switching ratios in VO$_2$ become larger as we move to longer wavelengths. The optical switching ratios for the various samples fabricated in this study are listed in Table 3.

The optical transmittance is exponentially dependent on the film thickness. The data listed in Table 3 confirms that the thickest VO$_2$ film exhibits the highest electrical and optical switching properties.

Example 3

Fabrication of Crystalline VO$_2$ Films on Other Substrates

To demonstrate that the disclosed method is substrate-independent, vanadium oxide was deposited on silicon (Si) and quartz substrates.

Silicon Substrate

Figure 8A:
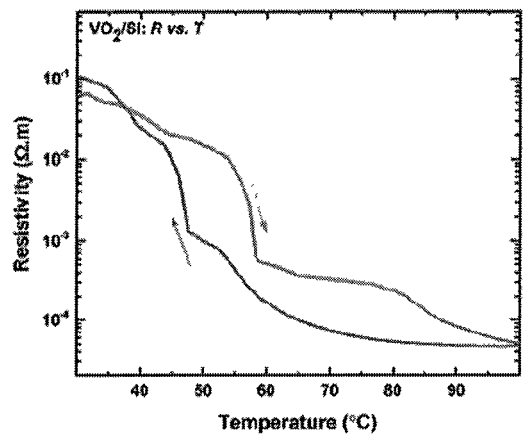
FIG. 8a is a graph of resistivity vs. temperature showing IMT from a $VO_2$ film fabricated by annealing after deposition on silicon substrate.
Figure 8B:
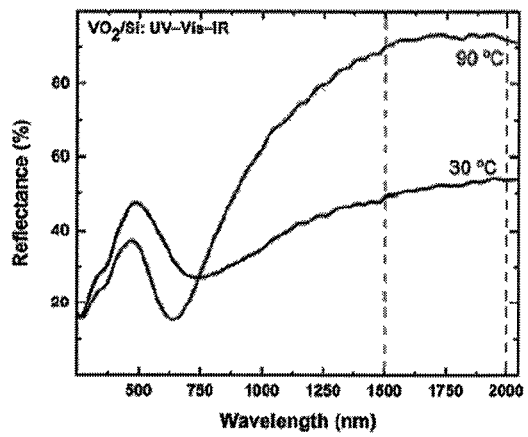
Figure 9A:
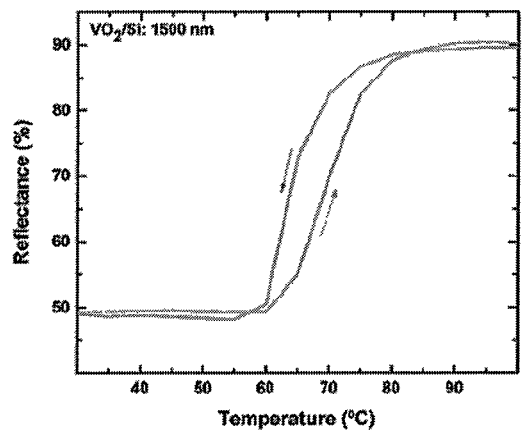
FIGS. 9a and 9b are optical reflectance vs temperature graphs from a crystalline $VO_2$ film fabricated by annealing after deposition on a silicon substrate, measured at optical wavelengths of: a) 1500 nm and b) 2000 nm.
Figure 9B:
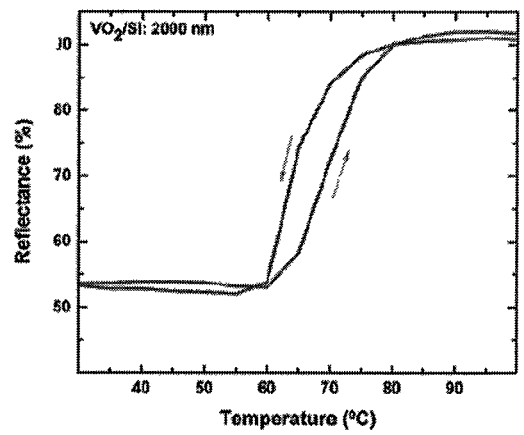

Electrical and optical characteristics of a VO$_2$ thin film deposited on a silicon substrate are shown in FIGS. 8*a*, 8*b*, 9*a* and 9*b*. FIGS. 8*a* and 8*b* shows that the IMT and the optical transition of the crystalline VO$_2$ thin films (213) exist when a silicon substrate (104, 204) is used. To assess the reflectance at different infrared wavelengths, cyclic reflection data is collected at two infrared wavelengths of 1500 and 2000 nm (as in the case of VO2 on glass) and are shown in FIGS. 9*a* and 9*b*, respectively. From a reflectance of ~49% (1500 nm) and ~52% (2000 nm) at 30° C. (electrically insulating phase), the value rises to around 90% (1500 nm) and 91% (2000 nm) at 90° C. (metallic phase). It is seen that the electrical IMT switching is four orders of magnitude and optical transition is at least 40% irrespective of the substrate.

Quartz Substrate

Figure 10A:
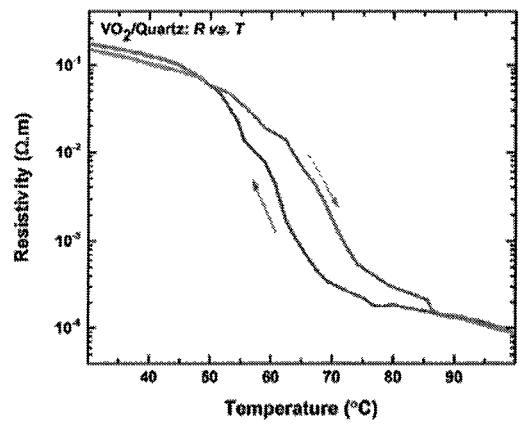
FIG. 10a is a graph of resistivity vs. temperature showing IMT from a $VO_2$ film fabricated by annealing after deposition on quartz substrate.
Figure 10B:
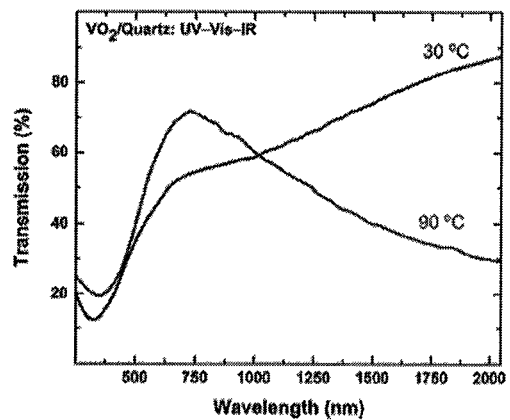

Similar deposition and characterisation was undertaken with success on quartz substrates (104, 204) to achieve electrical change of 10$^4$ and optical discrimination of 55% at 2000 nm (see FIGS. 10*a* and 10*b*). Room temperature deposition results in amorphous VO$_2$ with the correct chemical composition.

Example 4

Frequency Dependence of Resistivity of VO$_2$ Films

In order to assess the high-frequency resistivity of the crystalline VO$_2$ thin films, characterization at terahertz-range frequencies was observed. A transmission line-based equivalent circuit model is employed to analyse the results of the terahertz time-domain spectroscopy (THz-TDS) measurements. For this model, the air and dielectric media are treated as lengths of transmission line, and the VO$_2$ thin film is approximated as a lumped shunt impedance. This approximation is valid due to the low electrical length of the film thickness, which is less than 0.2% of a wavelength, and hence any wave propagation effects within the finite-thickness film can be neglected. The value of the shunt impedance

TABLE 3

| O$_2$ molar concentration in Ar (%) | Duration (min) | Film thickness (nm) | Switching ratio (R$_{30}$/R$_{90}$) | Rate of change (Ω · m/° C.) | Rate of change (Ω · m/min) | Optical switching at 2,000 nm (%) |
|---|---|---|---|---|---|---|
| 30 | 15 | 50.4 | 1289 | 8 | 32 | ~40% |
| 30 | 30 | 100.8 | 455 | 38 | 150 | ~58% |
| 30 | 45 | 151.2 | 2309 | 28 | 111 | ~60% |
| 50 | 15 | 31.5 | 251 | 15 | 60 | ~25% |
| 50 | 30 | 63.0 | 714 | 7 | 30 | ~50% |
| 50 | 45 | 94.5 | 1433 | 21 | 84 | ~63% | is equal to the sheet impedance of the $VO_2$ layer, $Z_{VO2}=1/(t\sigma)$, where t is film thickness, and $\sigma$ is complex conductivity. Time-domain truncation is employed to mitigate confounding factors due to multiple reflection within the Si substrate, and this is possible due to the pulsed-signal nature of THz-TDS systems of this sort.

Figure 11:
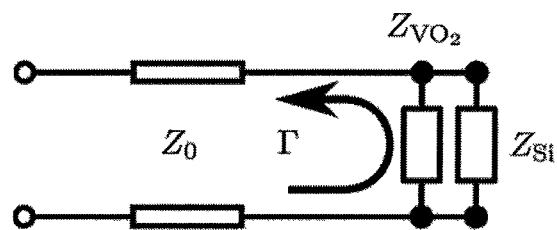
FIG. 11 is a circuit diagram for an equivalent circuit model employed to calculate the terahertz-range conductivity of $VO_2$.

For the transmission-line circuit model, this is equivalent to perfectly-matching the transmission line that represents the Si substrate, and hence it can be replaced by placing a second shunt impedance, $Z_{Si}$, in parallel with $Z_{VO2}$, as opposed to the transmission line length. The value of this shunt impedance is equal to the wave impedance of silicon, $Z_{Si}=Z_0/(\varepsilon Si) \sim 110\Omega$. This equivalent circuit model is shown in FIG. 11, and the reflection coefficient indicated, $\Gamma$, represents the reflection of the incident terahertz beam from the $VO_2$-coated silicon substrate, $$\Gamma = \frac{Z_{VO_2} \| Z_{Si} - Z_0}{Z_{VO_2} \| Z_{Si} + Z_0}.$$

It is noted that, as $VO_2$ is a poor conductor in its insulating phase, $Z_{VO2,\,insulating} \gg Z_{Si}$, and hence it will exert negligible impact on the input impedance. As such, the effective impedance of the conducting-phase $VO_2$ layer can be extracted from the ratio of the measured spectra, $r=E_{metallic}/E_{insulating}$, as follows, $$r = \frac{E_{metallic}}{E_{insulating}} = \frac{\Gamma_{metallic}}{\Gamma_{insulating}} = \frac{\frac{Z_{VO_2\cdot metallic}\|Z_{Si} - z_0}{Z_{VO_2\cdot metallic}\|Z_{Si} - z_0}}{\frac{Z_{Si} - Z_0}{Z_{Si} + Z_0}},$$

$$Z_{VO_2,metallic} = \frac{-Z_{Si}Z_0 - Z_0^2 - rZ_{Si}Z_0 + rZ_0^2}{r(Z_{Si} - Z_0) - Z_{Si} - Z_0}.$$

The terahertz-range resistivity of conducting-phase $VO_2$ is subsequently extracted from the resulting value of sheet impedance. This procedure is repeated for four $VO_2$-on-Si samples to construct the error bars, at one standard deviation, that are given in FIG. 12b.

Figure 12A:
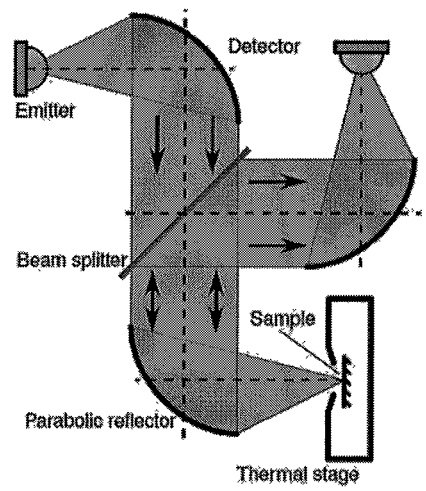
FIG. 12a is a schematic diagram of a reflective terahertz time-domain spectroscopy setup for measuring resistivity of $VO_2$ films deposited on silicon substrate in the terahertz frequency range, where the sample is heated using a thermal stage
Figure 12B:
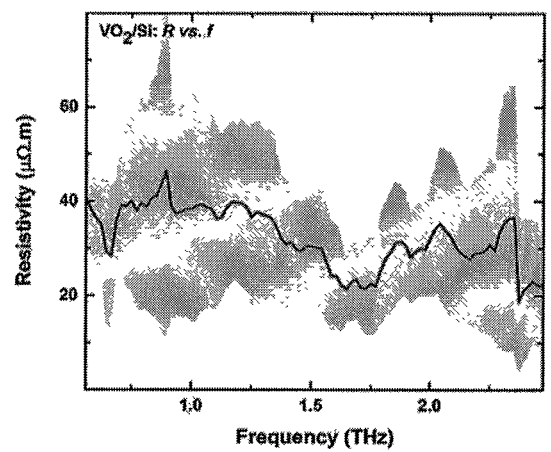
FIG. 12b is a graph showing calculated resistivity of metallic-phase crystalline $VO_2$ on silicon in the terahertz range, with error bars at one standard deviation shown as a shaded region.

FIG. 12a shows the terahertz time-domain spectroscopy (THz-TDS) setup used. THz-TDS is an effective technique for extracting carrier concentration and conductive properties of thin films. The crystalline $VO_2$ thin films on silicon was characterised at high temperature (metallic state). The results are shown in FIG. 12b with resistivity of ~0.5×10-4 $\Omega\cdot$m across a frequency range of 0.5-2.5 THz. This is consistent with the DC resistivity results presented in FIGS. 5a and 5b. This highlights that crystalline $VO_2$ retains its key electronic features even at high frequencies.

Example 5

Repeatability of IMT

Figure 13A:
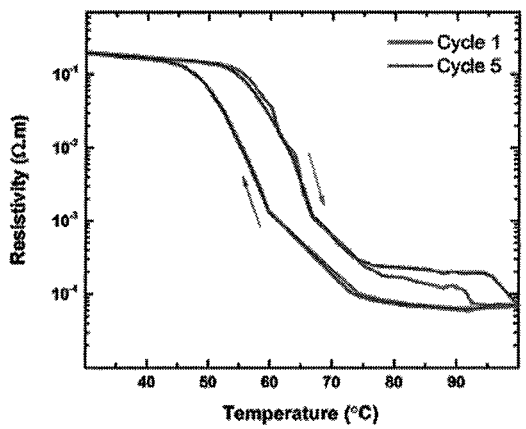
FIG. 13a is a resistivity vs temperature graph from a post-deposition annealed crystalline $VO_2$ film on a glass substrate for the first and fifth sweeps in cyclic testing.
Figure 13B:
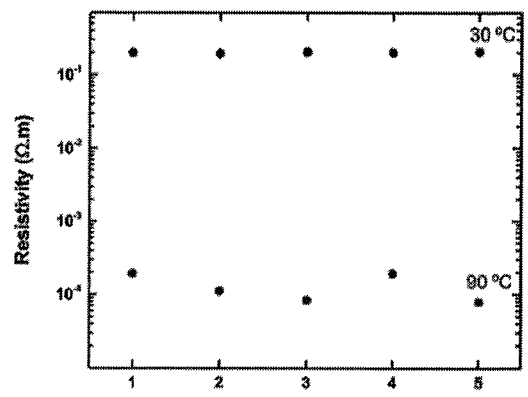

The IMT is reversible and repeatable as the crystalline $VO_2$ films display recovery after the removal of the thermal stimulus for the IMT. FIGS. 13a and 13b show that the films undergo consistent and repeatable IMT when heat is re-applied. FIG. 13a shows near identical behaviour between Cycle 1 and Cycle 5 of the crystalline $VO_2$ films being heated and allowed to cool down continuously. This consistency is also apparent in FIG. 13b.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The present disclosure is further defined by the following numbered paragraphs:

1. A method for fabricating a crystalline vanadium oxide ($VO_2$) film comprising the steps of:
   a) depositing an amorphous $VO_2$ film on a substrate by pulsed DC magnetron sputtering using a vanadium target, wherein the substrate is exposed to a sputtering gas comprising an inert process gas and oxygen ($O_2$), and the substrate has a temperature of less than about 50° C.; and
   b) annealing the deposited amorphous $VO_2$ film to crystallise the amorphous $VO_2$ film into a crystalline $VO_2$ film that exhibits an insulator-metal transition.
2. The method according to paragraph 1, wherein the annealing is performed at a pressure in the range of about 20 Pa to about 50 Pa.
3. The method according to paragraphs 1 or 2, wherein the annealing is performed at a pressure in the range of about 30 Pa to about 40 Pa.
4. The method according to any one of paragraphs 1 to 3, wherein the substrate temperature is in the range from about 20° C. to about 30° C.
5. The method according to any one of paragraphs 1 to 4, wherein the substrate temperature is about room temperature.
6. The method according to any one of paragraphs 1 to 5, wherein the inert process gas is argon (Ar).
7. The method according to paragraph 6, wherein the sputtering gas has an $O_2$ molar concentration in Ar in a range from about 20% to about 60%.
8. The method according to paragraphs 6 or 7, wherein the sputtering gas has an $O_2$ molar concentration in Ar of about 30%.
9. The method according to any one of paragraphs 6 to 8, wherein the sputtering gas is flowing with an $O_2$ flow rate of about 5.25 sccm and an Ar flow rate of about 12.25 sccm.
10. The method according to any one of paragraphs 1 to 9, further comprising evacuating a sputtering chamber to a base pressure of about $5.3\times10^{-5}$ Pa and wherein the pulsed DC magnetron sputtering is performed while the sputtering gas is at a pressure of about $3.7\times10^{-1}$ Pa.
11. The method according to any one of paragraphs 1 to 10, wherein the pulsed DC magnetron sputtering is performed with a sputtering power of about 200 W, a pulse frequency of about 25 kHz, and a reverse time of about 5 μs.
12. The method according to any one of paragraphs 1 to 11, wherein the substrate is placed at a distance from the vanadium target in the range from about 5 cm to about 25 cm.
13. The method according to any one of paragraphs 1 to 12, wherein the substrate is placed at a distance from the vanadium target of about 12 cm.
14. The method according to any one of paragraphs 1 to 13, wherein the annealing is at a temperature in the range from about 500° C. to about 570° C.
15. The method according to any one of paragraphs 1 to 14, wherein the annealing is at a temperature of about 550° C.
16. The method according to any one of paragraphs 1 to 15, wherein the annealing is for a period of time from about 30 minutes to about 120 minutes.

17. The method according to any one of paragraphs 1 to 16, wherein the annealing is for a period of time of about 90 minutes.
18. The method according to any one of paragraphs 1 to 17, wherein the substrate is selected from the group consisting of glass, silicon and quartz.
19. The method according to any one of paragraphs 1 to 18, wherein the deposited amorphous $VO_2$ film and/or the fabricated crystalline $VO_2$ film has a thickness greater than about 50 nm.
20. The method according to any one of paragraphs 1 to 19, wherein the crystalline $VO_2$ film exhibits the insulator-metal transition (IMT) at a characteristic temperature from about 65° C. to about 75° C.
21. A crystalline vanadium-oxide ($VO_2$) film fabricated by the method according to any one of paragraphs 1 to 20.
22. A crystalline vanadium-oxide ($VO_2$) film fabricated by a method comprising the steps of:
 a) depositing an amorphous $VO_2$ film on a substrate by pulsed DC magnetron sputtering using a vanadium target, wherein the substrate is exposed to a sputtering gas comprising an inert process gas and oxygen ($O_2$), and the substrate has a temperature of less than about 50° C.; and
 b) annealing the deposited amorphous $VO_2$ film to crystallise the amorphous $VO_2$ film into a crystalline $VO_2$ film that exhibits an insulator-metal transition.
23. The crystalline vanadium-oxide ($VO_2$) film according to paragraph 22, wherein the annealing is performed at a pressure in the range of about 20 Pa to about 50 Pa.
24. The crystalline vanadium-oxide ($VO_2$) film according to paragraphs 22 or 23, wherein the annealing is performed at a pressure in the range of about 30 Pa to about 40 Pa.
25. The crystalline vanadium-oxide ($VO_2$) film according to any one of paragraphs 22 to 24, wherein the substrate temperature is in the range from about 20° C. to about 30° C.
26. The crystalline vanadium-oxide ($VO_2$) film according to any one of paragraphs 22 to 25, wherein the substrate temperature is about room temperature.
27. The crystalline vanadium-oxide ($VO_2$) film according to any one of paragraphs 22 to 26, wherein the inert process gas is argon (Ar).
28. The crystalline vanadium-oxide ($VO_2$) film according to paragraph 27, wherein the sputtering gas has an $O_2$ molar concentration in Ar in a range from about 20% to about 60%.
29. The crystalline vanadium-oxide ($VO_2$) film according to paragraphs 27 or 28, wherein the sputtering gas has an $O_2$ molar concentration in Ar of about 30%.
30. The crystalline vanadium-oxide ($VO_2$) film according to any one of paragraphs 27 to 29, wherein the sputtering gas is flowing with an $O_2$ flow rate of about 5.25 sccm and an Ar flow rate of about 12.25 sccm.
31. The crystalline vanadium-oxide ($VO_2$) film according to any one of paragraphs 22 to 30, further comprising evacuating a sputtering chamber to a base pressure of about $5.3 \times 10^{-5}$ Pa and wherein the pulsed DC magnetron sputtering is performed while the sputtering gas is at a pressure of about $3.7 \times 10^{-1}$ Pa.
32. The crystalline vanadium-oxide ($VO_2$) film according to any one of paragraphs 22 to 31, wherein the pulsed DC magnetron sputtering is performed with a sputtering power of about 200 W, a pulse frequency of about 25 kHz, and a reverse time of about 5 µs.
33. The crystalline vanadium-oxide ($VO_2$) film according to any one of paragraphs 22 to 32, wherein the substrate is placed at a distance from the vanadium target from about 5 cm to about 25 cm.
34. The crystalline vanadium-oxide ($VO_2$) film according to any one of paragraphs 22 to 33, wherein the substrate is placed at a distance from the vanadium target of about 12 cm.
35. The crystalline vanadium-oxide ($VO_2$) film according to any one of paragraphs 22 to 34, wherein the annealing is at a temperature in the range from about 500° C. to about 570° C.
36. The crystalline vanadium-oxide ($VO_2$) film according to any one of paragraphs 22 to 35, wherein the annealing is at a temperature of about 550° C.
37. The crystalline vanadium-oxide ($VO_2$) film according to any one of paragraphs 22 to 36, wherein the annealing is for a period of time from about 30 minutes to about 120 minutes.
38. The crystalline vanadium-oxide ($VO_2$) film according to any one of paragraphs 22 to 37, wherein the annealing is for a period of time of about 90 minutes.
39. The crystalline vanadium-oxide ($VO_2$) film according to any one of paragraphs 22 to 38, wherein the substrate is selected from the group consisting of glass, silicon and quartz.
40. The crystalline vanadium-oxide ($VO_2$) film according to any one of paragraphs 22 to 39, wherein the deposited amorphous $VO_2$ film and/or the fabricated crystalline $VO_2$ film has a thickness greater than about 50 nm.
41. The crystalline vanadium-oxide ($VO_2$) film according to any one of paragraphs 22 to 40, wherein the fabricated crystalline $VO_2$ film exhibits the insulator-metal transition at a characteristic temperature from about 65° C. to about 75° C.

Having thus described in detail various embodiments of the present disclosure, it is to be understood that the present disclosure defined by the above numbered paragraphs is not to be limited to particular details set forth in the above description as many apparent variations thereof are possible without departing from the spirit or scope of the present disclosure.

The invention claimed is:

1. A method for fabricating a crystalline vanadium oxide ($VO_2$) film, comprising:
 depositing an amorphous $VO_2$ film on a substrate by pulsed DC magnetron sputtering using a vanadium target, wherein the substrate is exposed to a sputtering gas comprising an inert process gas and oxygen ($O_2$), and the substrate has a temperature of less than 50° C.; and
 annealing the deposited amorphous $VO_2$ film to crystallise the amorphous $VO_2$ film into a crystalline $VO_2$ film that exhibits an insulator-metal transition,
 wherein at least 80% of the vanadium in the crystalline $VO_2$ film has an oxidation state of $V^{4+}$ when measured using X-ray photoelectron spectroscopy (XPS).
2. The method according to claim 1, wherein the annealing is performed at a pressure in the range of about 20 Pa to about 50 Pa.
3. The method according to claim 2, wherein the annealing is performed at a pressure in the range of about 30 Pa to about 40 Pa.
4. The method according to claim 1, wherein the substrate temperature is in the range from about 20° C. to about 30° C.

5. The method according to claim 4, wherein the substrate temperature is about room temperature.

6. The method according to claim 1, wherein the inert process gas is argon (Ar).

7. The method according to claim 6, wherein the sputtering gas has an $O_2$ molar concentration in Ar in a range from about 20% to about 60%.

8. The method according to claim 7, wherein the sputtering gas has an $O_2$ molar concentration in Ar of about 30%.

9. The method according to claim 6, wherein the sputtering gas is flowing with an $O_2$ flow rate of about 5.25 sccm and an Ar flow rate of about 12.25 sccm.

10. The method according to claim 1, wherein the substrate is placed at a distance from the vanadium target in the range from about 5 cm to about 25 cm.

11. The method according to claim 10, wherein the substrate is placed at a distance from the vanadium target of about 12 cm.

12. The method according to claim 1, wherein the annealing is at a temperature in the range from about 500° C. to about 570° C.

13. The method according to claim 12, wherein the annealing is at a temperature of about 550° C.

14. The method according to claim 1, wherein the annealing is for a period of time from about 30 minutes to about 120 minutes.

15. The method according to claim 14, wherein the annealing is for a period of time of about 90 minutes.

16. The method according to claim 1, wherein the substrate is selected from the group consisting of glass, silicon and quartz.

17. The method according to claim 1, wherein the deposited amorphous $VO_2$ film and/or the fabricated crystalline $VO_2$ film has a thickness greater than 50 nm.

18. The method according to claim 1, wherein the crystalline $VO_2$ film exhibits the insulator-metal transition (IMT) at a characteristic temperature of about 69° C.

19. The method according to claim 1, wherein the crystalline $VO_2$ film is a single-phase crystalline $VO_2$ film and the vanadium in the crystalline $VO_2$ film consists exclusively of $V^{4+}$ when measured using X-ray photoelectron spectroscopy (XPS).

20. A method for fabricating a crystalline vanadium oxide ($VO_2$) film, comprising:
depositing an amorphous $VO_2$ film on a substrate by pulsed DC magnetron sputtering using a vanadium target, wherein the substrate is exposed to a sputtering gas comprising argon and oxygen ($O_2$), the substrate has a temperature of about 20° C. to about 30° C., and wherein the sputtering gas has an $O_2$ molar concentration in argon is in a range from about 20% to about 60%; and
annealing the deposited amorphous $VO_2$ film at a pressure in the range of about 20 Pa to about 50 Pa to crystallise the amorphous $VO_2$ film into a crystalline $VO_2$ film that exhibits an insulator-metal transition,
wherein at least 80% of the vanadium in the crystalline $VO_2$ film has an oxidation state of $V^{4+}$ when measured using X-ray photoelectron spectroscopy (XPS).

\* \* \* \* \*